(12) United States Patent
Boswell et al.

(10) Patent No.: US 6,751,570 B2
(45) Date of Patent: Jun. 15, 2004

(54) RF FIXTURE ELECTRONICS FOR TESTING RF DEVICES

(75) Inventors: Bryan D. Boswell, Loveland, CO (US); Richard E. Warren, Loveland, CO (US); Gregory E. Brandes, Fort Collins, CO (US); Terrence Jones, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 178 days.

(21) Appl. No.: 10/001,554

(22) Filed: Oct. 31, 2001

(65) Prior Publication Data

US 2003/0083839 A1 May 1, 2003

(51) Int. Cl.⁷ .............................................. G01R 31/02
(52) U.S. Cl. ...................................... 702/121; 324/750
(58) Field of Search ............................. 702/121, 57–59, 702/81, 84, 117, 118, 120, 122; 324/750, 759, 763; 340/514, 515, 596

(56) References Cited

U.S. PATENT DOCUMENTS 5,777,873 A * 7/1998 Cox et al. ...................... 700/79
6,509,753 B2 * 1/2003 Euker ............................ 324/755
6,525,657 B1 * 2/2003 Wojcik .......................... 340/514

\* cited by examiner

Primary Examiner—Marc S. Hoff
Assistant Examiner—Edward Raymond

(57) ABSTRACT

A system, designed to interact electronically with an RF device, is able to test many types of RF devices and is operable to apply a variety of test inputs to an RF device. The RF device, located within a nest inside an RF enclosure, interacts with the system via a nest electronics component. The nest electronics component, located within the RF enclosure and coupled to a nest interface component and a fixture interface component, supplies power and input test signals to the RF device. The nest electronics component may be configured to interact with a particular RF device, which allows the RF enclosure to used with different types of RF devices. The arrangement of these components allows control and measurement of the RF device to be located as close to it as possible and also allows functionality not required within the RF enclosure to be externally located.

56 Claims, 7 Drawing Sheets

RF FIXTURE ELECTRONICS FOR TESTING RF DEVICES

TECHNICAL FIELD

This invention relates generally to the field of radio frequency (RF) test and measurement systems, and more specifically to the electrical and software components useful for test and measurement within RF enclosures.

BACKGROUND OF THE INVENTION

RF enclosures may be used in a variety of test and measurement applications when the amount of RF radiation that impacts a device under test (DUT) must be carefully controlled. Specific examples include prototype testing and production testing of cellular telephones, portable computers, pagers, and other small electronic devices. Often RF enclosures are used in automated or semi-automated environments in which machines are used to place the DUT inside the RF enclosure. In these types of test environments, it is desirable to be able to evaluate the functionality and correct operation of the DUT while the DUT is within the RF enclosure. The use of electronics circuitry and software may be used to apply specific test resources to the DUT and measure the responses. In most applications, the electronics circuitry and software is located both internal and external to the RF enclosure. However, placing high speed electronics within the RF enclosure reduces the RF isolation and therefore degrades the testing accuracy. The proximity of the RF electronics to the DUT also influences the measurement accuracy. Thus, in test and measurement situations involving RF devices there are often two competing design considerations: Including more sophisticated electronic components within an RF enclosure allows more accurate and more comprehensive test procedures to be executed. However from the point of view of RF isolation and noise reduction, fewer electronics components creates smaller amounts of spurious RF energy which leads to improved RF measurements. These competing considerations must both be addressed when designing RF test and measurement systems that incorporate RF enclosures.

Referring now to FIG. 1, a block diagram of RF electronics and software suitable for testing RF devices within an RF enclosure is shown, according to the prior art. A system controller 110 is coupled to a fixture controller 130 in order to send to RF device 150 and receive information from RF device 150. It should be noted that in general, fixture controller 130 is operable to have functionality internal and external to RF enclosure 120. Fixture controller 130 interacts with custom electronics and software 140 to generate test inputs and receive test outputs from the RF device 150. RF device 150 may be coupled directly to the custom electronics 140 or may also be coupled to a nest 160 that is then coupled to custom electronics 140. Nest 160 is often used as the point of attachment for RF device 150, and is operable to provide sensors that measure the state of RF device 150.

It should be noted that the structure of FIG. 1 is representative of the type of fixture system functionality that is currently implemented, although other approaches can be used. The use of custom electronics within the RF enclosure limits the applicability of the RF test system to types of RF devices with different test requirements. Often a particular RF test system is designed to test a particular RF device. So, when a new RF device product line is introduced, a new RF test system must be created. Also, the use of fixture control functionality internal and external to the RF enclosure may be unnecessary, provided that the control functionality external to the RF enclosure can perform the equivalent tasks. An additional issue with the RF test systems currently used is the location of the electronics within the RF enclosure. Ideally, the electronics should be located as close to the RF device under test as possible, since this improves the measurement accuracy. It is also desirable for this circuitry to keep the number of data lines leaving the RF enclosure to a minimum. In many of the current RF test systems, emphasis is placed upon providing the desired measurement functionality. This goal is attained at the expense of providing optimal location of test electronics.

A very important aspect of RF fixture design is the association of information that is unique to the RF device as it relates to the RF fixturing system and the overall test process. This association is particularly important as RF fixturing systems are shared across multiple RF device test plans, as well as, individual fixtures for a particular RF device. This information often consists of test equipment identification, test path calibration constants, and configuration management data required for the test process. Existing solutions for integrating product specific test information into the test process range from very simple hard-coded schemes that are embedded right into the test plan to highly sophisticated database oriented solutions. Each scheme has its unique advantages and disadvantages. The most simplistic solutions lack the flexibility to support multiple unique RF devices, while the more advanced solutions require centralized network connections to be available and are often very expensive.

Thus, there is an unmet need in the art for a RF fixturing system that minimizes the amount of electronics circuitry required within the RF enclosure, that is applicable to a number of RF devices, that places the RF electronics as close to the measurement location as possible, that reduces the number of data lines entering the RF enclosure, and that allows product-specific test information to be stored and retrieved within the RF fixturing system in a convenient, configurable and cost-effective manner.

SUMMARY OF THE INVENTION

The RF fixturing system of the present invention allows a plethora of RF devices to be tested using a standard configuration of electronics components of an RF test fixture in combination with device-specific resources resident on one or more electronic customizations or nests. Testing different RF devices can be accomplished by changing the type of customization or nest that is inserted within the RF enclosure. The system thus contains at least an RF test fixture having a standard set of electronics, a nest operable to receive an RF device to be tested in the RF test fixture, and an interface element operable as an interface between the standard set of electronics of the RF test fixture and the RF device. The functionality of the nest that is specific to the RF device within the nest and the functionality of the standard set of electronics work in combination to facilitate testing of the RF device. Different RF devices may be easily tested by substituting different nest having functionality directed more to one or more RF devices to be tested within the RF test fixture.

Depending upon the test and measurement requirements, multiple nests may be present within the RF fixturing system. A RF device is coupled to the nest within the RF enclosure. The nest contains specific features that allow the particular RF device within the nest to be properly tested or evaluated. One of the features located on the nest is a non-volatile memory device. This memory device may be used to store and retrieve product-specific test information, such as nest information, calibration information, test algorithms, operational programs, and other information relevant to the test process. This collection of information may be nest-specific and can be changed depending upon the type of RF device under test. Placing this information in non-volatile memory within the nest allows RF device-specific information to be stored close to the RF device, modified easily, and retrieved easily during a test process.

The nest or "customization" is coupled to a nest interface component that serves as the interface between a standard set of resources located within the RF enclosure and the RF device. The standard set of electronics within the RF test fixture provides the electronic resources, preferably at the correct physical location within the fixture, to test a wide array of test devices without requiring customization of test electronics for each device to be tested. Through proper physical partitioning, proper sizing of the number of electronic resources, and by providing the required (or at least most widely used) types of electronic resources, the present invention makes adapting an RF test fixture to test various RF devices faster to implement, better performing and more general purpose. The present invention provides a standard set of requirements/resources for the implementation of many common types of customizations and thus provides for the rapid replacement of such customizations in order to facilitate RF test fixture testing.

The standard set of electronics within the RF test fixture may be any desired functionality. In the test and measurement of RF devices, however, specific resources that may be included within this standard set of electronics may include, but are not limited to, the following: analog signal measurement and generation functionality like DMM multiplexers and voltage reference generators; digital inputs and outputs, including triggering; audio inputs and outputs including transducers and the associated interface and signal conditioning electronics; general purpose switching and signal routing; and communication signal conditioning like level-shifting. Other specific available resources might include: audio path amplifiers/filters/multiplexers for speakers, microphones, and vibration sensors; serial communications transceivers with programmable level shifting capabilities; programmable EEPROM for fixture identification, calibration data, and control program storage; standard interface and location for addition of DUT-specific customization/communication electronics; programmable analog and digital input/output signal lines for interfacing with and control of the DUT; general-purpose relay switches of Form-A and Form-C types for customizable signal routing; digital signal control bus that allows programmable control of all internal test resources; sensor read-back circuitry that allows detection of changes in the position or presence of physical elements inside the fixture; temperature sensor to indicate temperature inside the RF enclosed portion of the fixture; trigger signal multiplexers and signal conditioning, power delivery and sensing functionality for the DUT; and pneumatic switch controller electronics.

The judicious use of analog multiplexing within the RF chamber, in addition to the high degree of digital signal compression obtained using the digital multiplexing over a serial bus, results in reducing the number of signals that are required to traverse the RF barrier. Examples of such analog multiplexing include the audio multiplexing of the source and measurement channels, DMM measurement channel multiplexing, and trigger multiplexing. Such switching allows a large number of test and measurement resources to be provided to the DUT without compromising the RF integrity or signal fidelity of the test system.

The nest interface provides a medium for a variety of sensors and input signals to be applied to an RF device under test (DUT). Often the DUT is placed between an upper nest and a lower nest. Each nest contains specific test and measurement functionality that allows test signals to be applied to the DUT in specific locations. As an example, a cellular telephone contains a speaker that may be more easily tested using a lower nest interface sensor, while the cellular telephone may also contain a microphone that is most easily tested using an upper nest sensor. The provision of more than one nest allows test measurement functionality to be located as close to the measurement location as possible.

Either the upper nest or the lower nest may be coupled to a nest interface component. The nest interface component allows the fixturing system to create test inputs to be applied to the DUT and retrieve test results from the upper nest or the lower nest. The nest interface component allows a wide range of test inputs to be created and applied to the DUT via the nest components. The nest interface component also contains functionality sufficient for receiving the test results from the upper nest or lower nest and processing the results for transmission to a system controller. The location of the nest interface component minimizes the amount of information that needs to be transferred out of the RF enclosure. Thus, the location of the nest interface component effectively increases the RF isolation of the RF enclosure. The nest interface component communicates with electronics components external to the RF enclosure via a fixture interface component.

The fixture interface component provides external RF fixture components a gateway to the electronics components internal to the RF enclosure. The fixture interface component receives information from an external controller via a filtered connector and contains sufficient processing functionality to interpret these commands and interact with the nest interface component, the upper nest and lower nest to achieve test and measurement objectives. The fixture interface component also contains sufficient functionality to format and transmit test results from components internal to the RF enclosure to the external controller. The external controller interacts with the fixture interface to send and receive test specific information as well as diagnostic information and system level commands. System-level commands include commands to change the state of the RF enclosure as well as commands to change the state of the DUT. A system controller, external to the fixturing device, is operable to collect and process test information related to the DUT. The system controller is coupled to the fixturing device via the fixture controller.

The location of the controller functionality external to the RF enclosure reduces the amount of spurious RF emanations and reduces the complexity of the electronics within the RF enclosure. The placement of the fixture interface separate from the DUT reduces the number of data bus lines that are required within the RF enclosure and also reduces the RF emissions within the RF enclosure.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
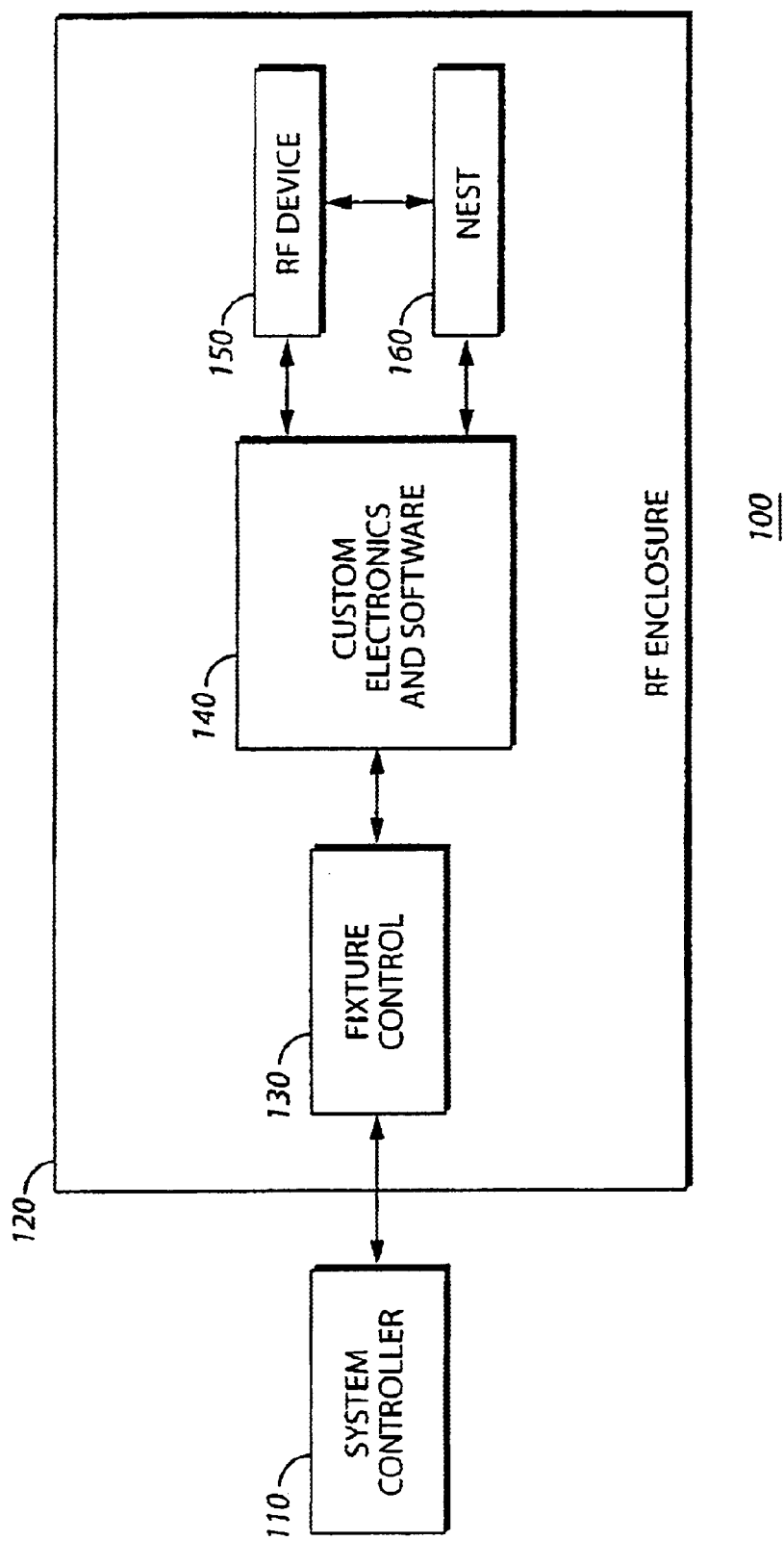
FIG. 1 is a drawing of RF electronics suitable for controlling an RF fixturing device, according to the prior art.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

The RF fixturing system of the present invention allows a plethora of RF devices to be tested using a standard configuration of electronics components. Testing different RF devices can be accomplished by changing the type of nest that is inserted within the RF enclosure. The system contains an RF test fixture having a standard set of electronics, a nest operable to receive an RF device to be tested in the RF test fixture, and an interface element operable as an interface between the standard set of electronics of the RF test fixture and the RF device. The functionality of the nest that is specific to the RF device within the nest and the functionality of the standard set of electronics work in combination to facilitate testing of the RF device. Different RF devices may be easily tested by substituting different nest having functionality directed more to one or more RF devices to be tested within the RF test fixture.

Depending upon the test and measurement requirements, multiple nests may be present within the RF fixturing system. A RF device is coupled to the nest within the RF enclosure. The nest contains specific features that allow the particular RF device within the nest to be properly tested or evaluated. One of the features located on the nest is a non-volatile memory device. This memory device may be used to store and retrieve product-specific test information, such as nest information, calibration information, test algorithms, operational programs, and other information relevant to the test process. This collection of information may be nest-specific and can be changed depending upon the type of RF device under test. Placing this information in non-volatile memory within the nest allows RF device-specific information to be stored close to the RF device, modified easily, and retrieved easily during a test process.

The nest or "customization" is coupled to a nest interface component that serves as the interface between a standard set of resources located within the RF enclosure and the RF device. The standard set of electronics within the RF test fixture provides the electronic resources, preferably at the correct physical location within the fixture, to test a wide array of test devices without requiring customization of test electronics for each device to be tested. Through proper physical partitioning, proper sizing of the number of electronic resources, and by providing the required (or at least most widely used) types of electronic resources, the present invention makes adapting an RF test fixture to test various RF devices faster to implement, better performing and more general purpose. The present invention provides a standard set of requirements/resources for the implementation of many common types of customizations and thus provides for the rapid replacement of such customizations in order to facilitate RF test fixture testing.

The standard set of electronics within the RF test fixture may be any desired functionality. In the test and measurement of RF devices, however, specific resources that may be included within this standard set of electronics may include, but are not limited to, the following: analog signal measurement and generation functionality like DMM multiplexers and voltage reference generators; digital inputs and outputs, including triggering; audio inputs and outputs including transducers and the associated interface and signal conditioning electronics; general purpose switching and signal routing; and communication signal conditioning like level-shifting. Other specific available resources might include: audio path amplifiers/filters/multiplexers for speakers, microphones, and vibration sensors; serial communications transceivers with programmable level shifting capabilities; programmable EEPROM for fixture identification, calibration data, and control program storage; standard interface and location for addition of DUT-specific customization/communication electronics; programmable analog and digital input/output signal lines for interfacing with and control of the DUT; general-purpose relay switches of Form-A and Form-C types for customizable signal routing; digital signal control bus that allows programmable control of all internal test resources; sensor read-back circuitry that allows detection of changes in the position or presence of physical elements inside the fixture; temperature sensor to indicate temperature inside the RF enclosed portion of the fixture; trigger signal multiplexers and signal conditioning, power delivery and sensing functionality for the DUT; and pneumatic switch controller electronics.

The nest interface provides a medium for a variety of sensors and input signals to be applied to an RF device under test (DUT). Often the DUT is placed between an upper nest and a lower nest. Each nest contains specific test and measurement functionality that allows test signals to be applied to the DUT in specific locations. As an example, a cellular telephone contains a speaker that may be more easily tested using a lower nest interface sensor, while the cellular telephone may also contain a microphone that is most easily tested using an upper nest sensor. The provision of more than one nest allows test measurement functionality to be located as close to the measurement location as possible.

Either the upper nest or the lower nest may be coupled to a nest interface component. The nest interface component allows the fixturing system to create test inputs to be applied to the DUT and retrieve test results from the upper nest or the lower nest. The nest interface component allows a wide range of test inputs to be created and applied to the DUT via the nest components. The nest interface component also contains functionality sufficient for receiving the test results from the upper nest or lower nest and processing the results for transmission to a system controller. The location of the nest interface component minimizes the amount of information that needs to be transferred out of the RF enclosure. Thus, the location of the nest interface component effectively increases the RF isolation of the RF enclosure. The nest interface component communicates with electronics components external to the RF enclosure via a fixture interface component.

The fixture interface component provides external RF fixture components a gateway to the electronics components internal to the RF enclosure. The fixture interface component receives information from an external controller via a RF filtered connector and contains sufficient processing functionality to interpret these commands and interact with the nest interface component, the upper nest and lower nest to achieve test and measurement objectives. The fixture interface component also contains sufficient functionality to format and transmit test results from components internal to the RF enclosure to the external controller. The external controller interacts with the fixture interface to send and receive test specific information as well as diagnostic information and system level commands. System-level commands include commands to change the state of the RF enclosure as well as commands to change the state of the DUT. A system controller, external to the fixturing device, is operable to collect and process test information related to the DUT. The system controller is coupled to the fixturing device via the fixture controller.

The location of the controller functionality external to the RF enclosure reduces the amount of spurious RF emanations and reduces the complexity of the electronics within the RF enclosure. The placement of the fixture interface separate from the DUT reduces the number of data bus lines that are required within the RF enclosure and also reduces the RF emissions within the RF enclosure.

It is noted that although three different electronic assemblies (the fixture interface, the nest interface, and the nest) are discussed herein, it is understood that the functionality represented by these assemblies may be combined into more or fewer assemblies without departing from the spirit and scope of the invention. The present invention provides a multiplicity of resources necessary to test RF devices and a way of interconnecting and customizing these resources for a specific DUT.

Figure 2:
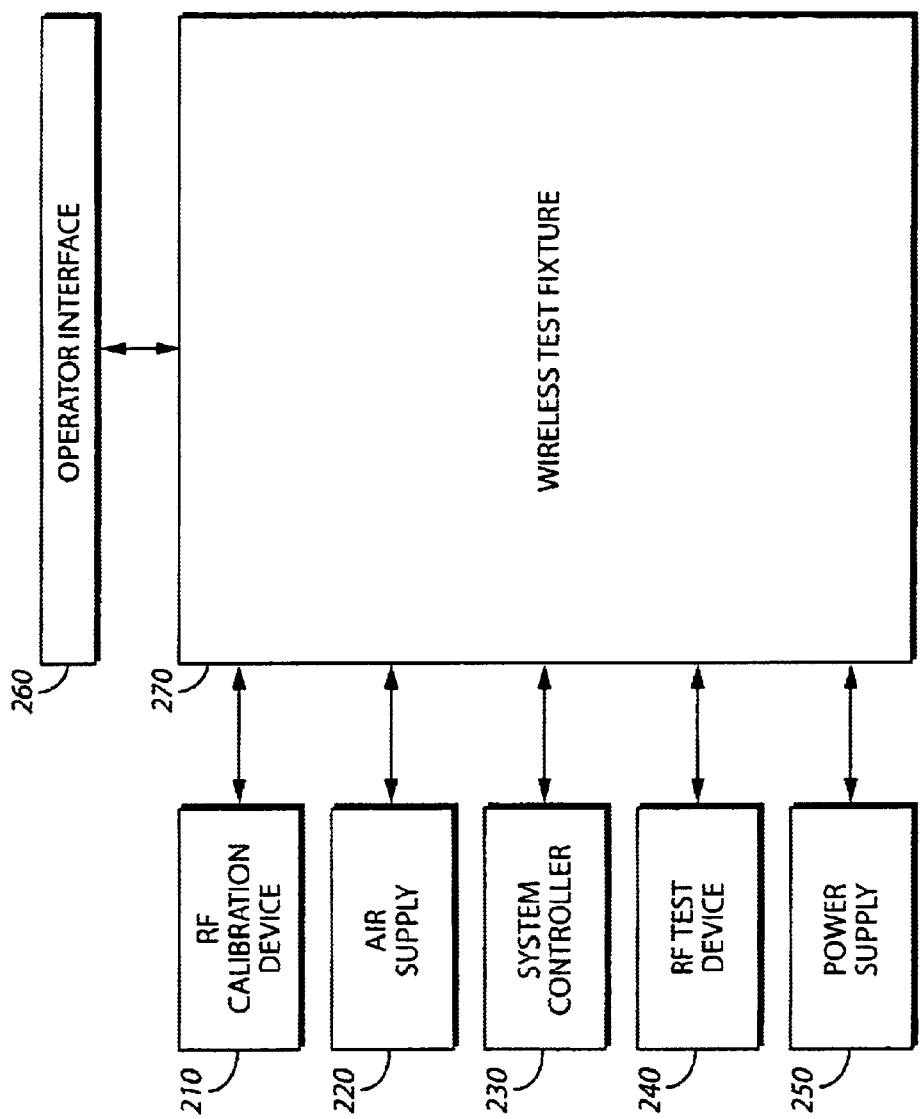
FIG. 2 is a system diagram of the external interfaces to an RF fixturing device, according to an embodiment of the present invention.

Referring now to FIG. 2, a block diagram 200 of the external interfaces to fixturing device 270 is shown, according to a method of the present invention. Fixturing device 270 has a number of interfaces to other fixturing components to provide the desired test and measurement capability. RF calibration device 210 is coupled to fixturing device 270 and provides calibrated input for verification purposes. An air supply component 220 is coupled to fixturing device 270 and provides a source of pressurized air necessary in implementations that use pneumatic pressure for fixture operation. A system controller 230 is coupled to the fixturing device 270 and provides external control and status measurement. System controller 230 is of ten the means by which a user is able to interact with fixturing device to control measurement functionality, although this is not a required component of the present invention. RF test device 240 is coupled to fixturing device 270 and provides test signal inputs sufficient to verify the correct operation of a RF device under test. It should be noted that RF test device 240 may be present in order to supplement the operation of the electronic components internal to fixturing device 270. A power supply component 250 is operable to supply power to fixturing device 270 as well as the RF device under test.

It will be noted that the components shown in FIG. 2, coupled to fixturing device 270, are examples of the components that could be coupled to fixturing device 270. In the spirit and scope of the present invention, all of these components do not need to be present and indeed additional components may be present without departing from the spirit and scope of the present invention.

Figure 3:
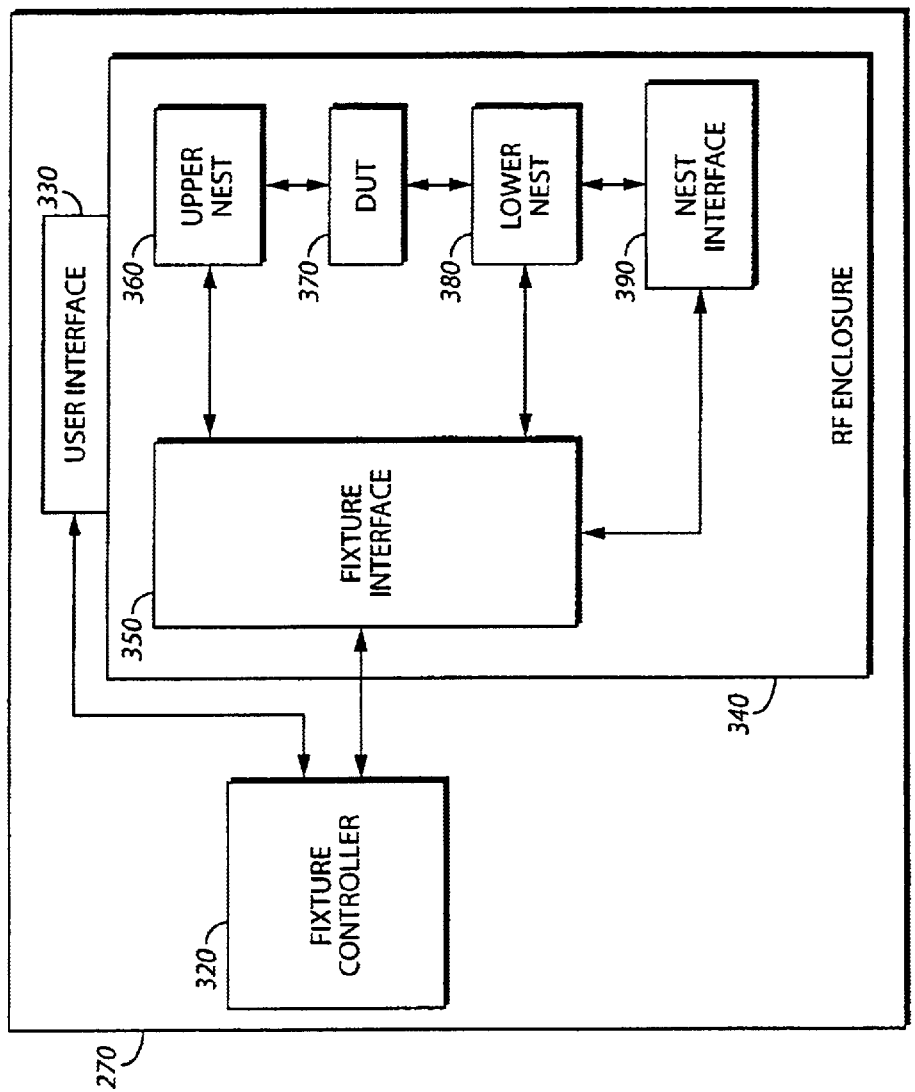
FIG. 3 is a system diagram of the internal organization of RF electronics suitable for controlling an RF fixturing device, according to an embodiment of the present invention.

Referring now to FIG. 3, a system diagram 300 of the internal organization of RF electronics suitable for controlling RF fixturing device 270 is shown, according to an embodiment of the present invention. RF fixturing device 270 comprises a fixture controller 320 that is operable to be coupled to system controller 230 and also coupled to fixture interface 350. Fixture controller 320 interacts with the electronics internal to RF enclosure 340 in order to send commands and receive information regarding fixturing device status and RF device under test status. Fixture controller 320 then communicates this information system controller 230 so that users of fixturing device 270 are aware of the operational status of a test of an RF device under test. Fixture controller 320 is also operable to interact with user interface 330 to send information and receive commands from a user of the fixturing device 270. In an embodiment of the present invention, fixture controller 320 comprises a micro-controller suitable to interpret commands received via an RS-232 interface and issue commands receivable by fixture interface 350.

Fixture interface 350, which is internal to RF enclosure 340 and coupled to fixture controller 320, is operable to collect measurement information from RF device under test (DUT) 370 and send command information to DUT 370. Fixture interface 350 is coupled to one or more of upper nest 360, lower nest 380, and nest interface 390. The results of test and measurements of DUT 370 are formatted and transmitted to fixture controller 320 by fixture interface 350. The formatting of test and measurement results attempts to reduce the amount of data crossing an interface of RF enclosure 340. Fixture interface 350 also is operable to sense the status of fixturing device 270, such as whether a nest is engaged or an access door is open. In an embodiment of the present invention, upper nest 360 is directly coupled to fixture interface 350, and fixture interface 350 is operable to collect and disseminate audio, signal, and temperature information.

DUT 370 is operable to be coupled above to upper nest 360 and below to lower nest 380. Lower nest 380 is further coupled to nest interface 390. Upper nest 360, lower nest 380 and nest interface 390 are coupled to fixture interface 350. Upper nest 360 and lower nest 380 allows test and measurement features to be applied directly to DUT 370. One or more DUT 370 measurement results are collected by upper nest 360 and lower nest 380, formatted, and transferred to fixture interface 350. Upper nest 360 and lower nest 380 provide a collection of measurement functionality that may be applied to DUT 370. This functionality includes one or more types of sensors, such as temperature sensors, audio sensors, vibration sensors, custom test signal generation, and other programmable customizations, which are capable of collecting various types of sensor data including, but not limited to, for example, mechanical position, vibration, acoustic energy, temperature, and electrical signals. The upper nest 360 and the lower nest 380 are operable to contain a nest component that enables direct communication with fixture interface 350 and nest interface 390. The nest component comprises non-volatile memory, customization connections, power supply interfaces, and interfaces to fixture interface 350 and interfaces to nest interface 390.

The nest interface 390 contains functionality sufficient to enable test and measurement of a number of different types of RF devices. General purpose signal generation capability as well as the ability to create generic test input signals are contained within nest interface 390. This capability includes one or more of audio transducer and associated signal conditioning (buzzer, vibration, speaker), custom programmable reference generation, and custom signal generation and conditioning. It should be noted that one of average skill in the art will recognize that nest interface 390 could be coupled to one or more of the upper nest 360 and the lower nest 380 without departing from the spirit and scope of the present invention. It is further noted that one of average skill in the art will realize that upper nest 360, lower nest 380, and nest interface 390 may not be included in fixturing device 270 without departing from the spirit and scope of the present invention.

Figure 4:
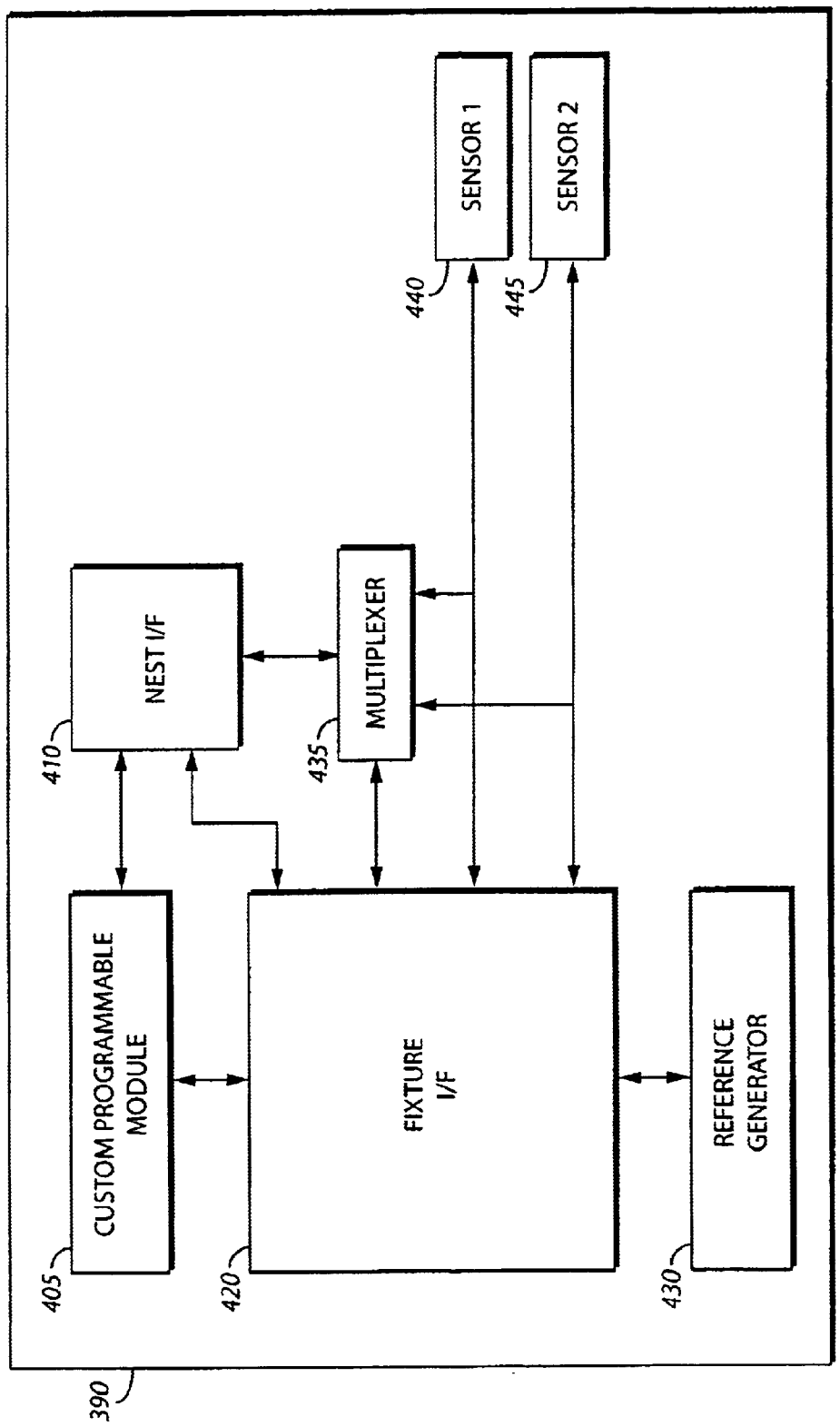
FIG. 4 is a block diagram of a nest interface, according to an embodiment of the present invention.

Referring now to FIG. 4, a more detailed block diagram 400 of nest interface 390 is shown, according to an embodiment of the present invention. The nest interface 390 interacts with a nest to generate and receive test and measurement information. The test interface 390 also interacts with fixture interface 350 to transfer the results of test measurements to electronics external to RF enclosure 340. One or more sensors (block 440 and block 445) collect DUT 370 specific information, which is then transferred to fixture interface (I/F) 420. The specific information may also optionally be multiplexed at multiplexor 435, so that the number of data lines near the nest is reduced. Multiplexor 435 also receives input data from nest I/F 410. Nest I/F 410 receives data from the nest and routes this data to fixture interface 350 via the fixture I/F 420 block. Additional functionality, such as custom programmable module 405 may be provided so that custom test signals may be created and applied to the DUT 370 via the nest I/F 410. The fixture I/F 410 of nest interface 390 is operable to use a bus format such as SPI to transfer data between the nest, fixture interface 350 and electronic components external to RF enclosure 340. Multiplexor 435 takes multiple inputs from the nest and the one or more sensors (block 440 and block 445) and creates a single data stream. This has the advantage of reducing the number of data lines inside the RF enclosure 340, which then reduces the amount of spurious RF emanations. It should be noted that the block diagram of FIG. 4 is a simplification of the actual electronics that would be required to create the desired functionality. In actual practice each block of FIG. 4 comprises multiple electronic components and the interconnections therein.

Figure 5:
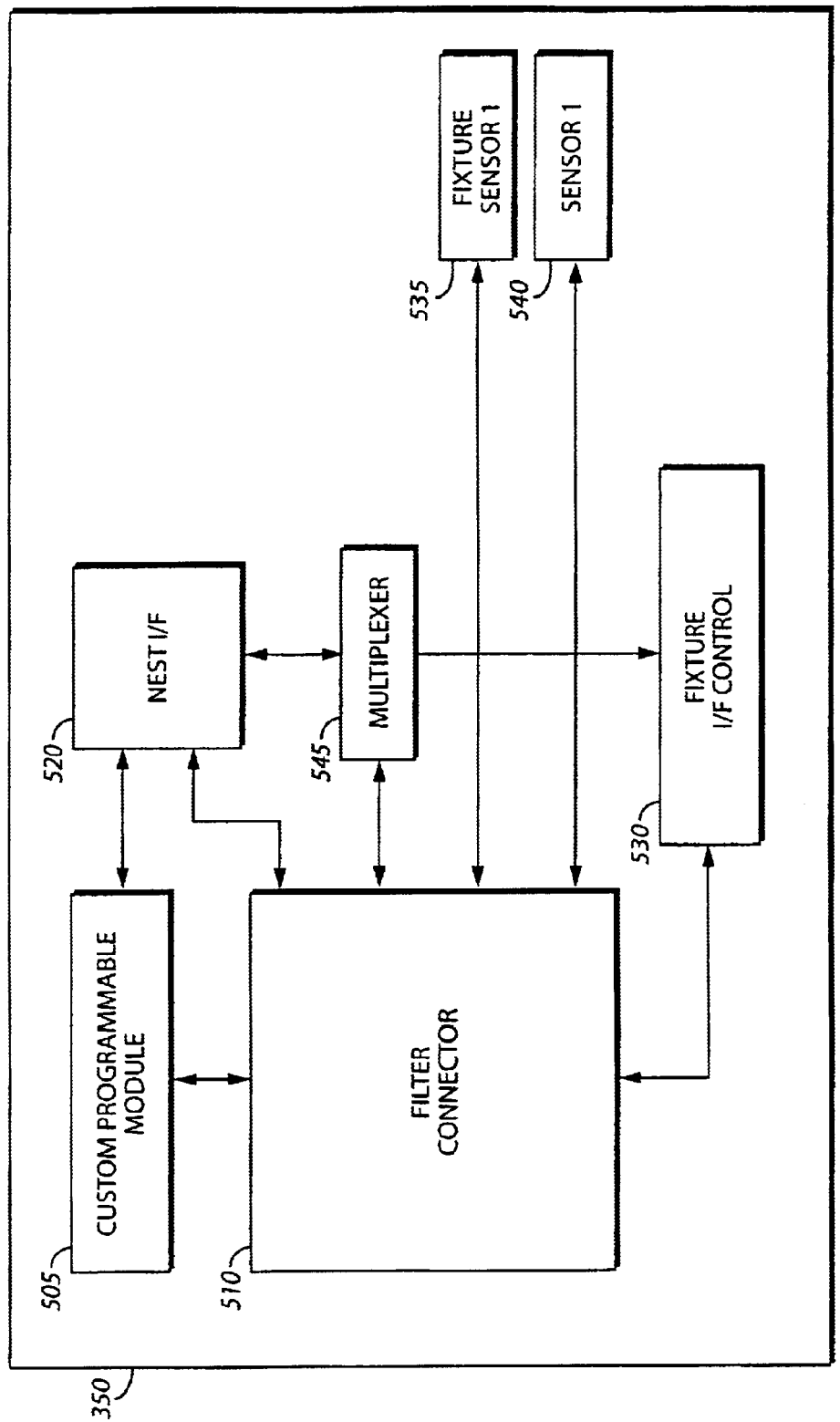
FIG. 5 is a block diagram of a fixture interface, according to an embodiment of the present invention.

Referring now to FIG. 5, a more detailed block diagram of fixture interface 350 is shown, according to an embodiment of the present invention. In a similar fashion to nest interface 390, fixture interface 350 also is operable to interact directly with the nest via nest I/F 520. Nest I/F 520 is operable to send data and receive data from the nest and nest interface 390. It should also be noted that the nest may be upper nest 360, lower nest 380 or both nests. Data received via nest I/F 520 is operable to be multiplexed at multiplexor 545 and transmitted to fixture controller 320 or sent directly to fixture controller 320 without multiplexing. The use of multiplexor 545 allows fewer data lines to be used within RF enclosure 340. In a similar manner, sensor data from one or more sensors (block 535 and block 540) may be transmitted to fixture controller 320. Data transmitted to fixture controller 320 from fixture interface 350 is coupled to filter connector 510. Filter connector 510 attenuates high-speed signals, thereby preserving the isolation integrity of the RF cavity. In a preferred embodiment of the present invention, the SPI bus is used to exchange data between the fixture interface 350 and the fixture controller 320. The requirements of specific RF device DUT's 370 not otherwise addressed within the standard functionality may be augmented through the use of a custom programmable module 505 which is coupled to nest I/F 520 and RF connector 510. Control and measurement of the fixturing device 270 state is operable to be controlled via fixture I/F control 530. Fixture I/F control 530 receives notification of the change in device fixture 270 status, such as "door open", or "nest disengaged".

Figure 6:
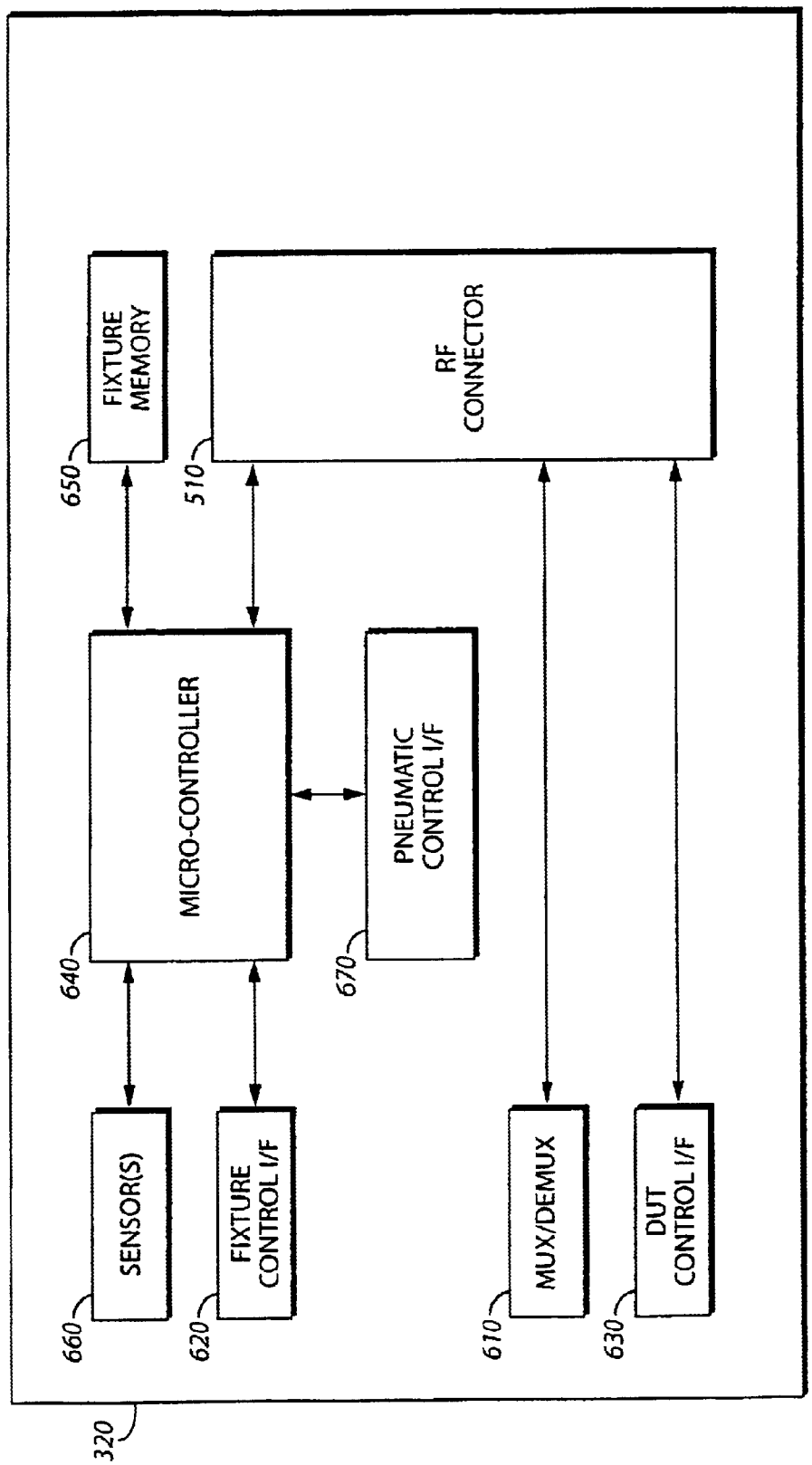
FIG. 6 is a block diagram of a fixture controller, according to an embodiment of the present invention.

Referring now to FIG. 6, a more detailed block diagram of the fixture controller 320 is shown, according to a preferred embodiment of the present invention. RF connector 510 sends data and receives data from fixture interface 350. In the preferred embodiment of the present invention, this data is transmitted and received using the SPI bus. Fixture controller 320 is coupled to fixture interface 350 via the RF connector 510. Fixture controller 320 also contains a multiplexor/de-multiplexor (mux/demux) 610 that is operable to convert data into a format suitable for fixture interface 350. A micro-controller 640, coupled to RF connector 510 and also coupled to fixture control I/F 620 is operable to translate external commands receivable via fixture control I/F 620 into a format acceptable to fixture interface 350. Fixture memory 650 is a non-volatile memory coupled to micro-controller 640 that provides calibration data and command data syntax to micro-controller 640. A third interface is a DUT control I/F 630, which is operable to send and receive data to the DUT 370 via RF connector 510. The fixture controller also contains one or more sensors 660 that measure the condition of various physical parameters. These are represented in a class of signals on the fixture controller 320 that provide control and status monitoring functionality of signals outside the RF chamber; access to these signals is not restricted, unlike signals inside the RF chamber. Such signals might include, for example, signals associated with the front panel, automation interface signals, EEPROM fixture signals, and signals associated with the pneumatics. The front panel and automation interfaces have signals that change states in real-time and thus need to be serviced on demand; having them outside the RF chamber facilitates this requirement. An Emergency Off (EMO) is an example of such a signal. The operator must be able to press an EMO at any time that they think an emergency situation might exist. Another example fixture controller sensor is a pneumatic pressure transducer.

The pneumatic control I/F 670 enables the microcontroller 640 to directly control numerous pneumatic devices like pneumatic-valves that are used to control pneumatic actuators. The pneumatic control lines provide direct control over the pneumatic valves of the fixture, which in turn control all of the pneumatic actuators, such as drawer, upper nest, nest engagements, etc., of the fixture. The presence of a pneumatic sensor allows the regulated pressure within the fixture to be monitored. A single pneumatic supply line may be fed into the rear panel of the fixture and multiplexed to multiple pneumatic valves.

Figure 7:
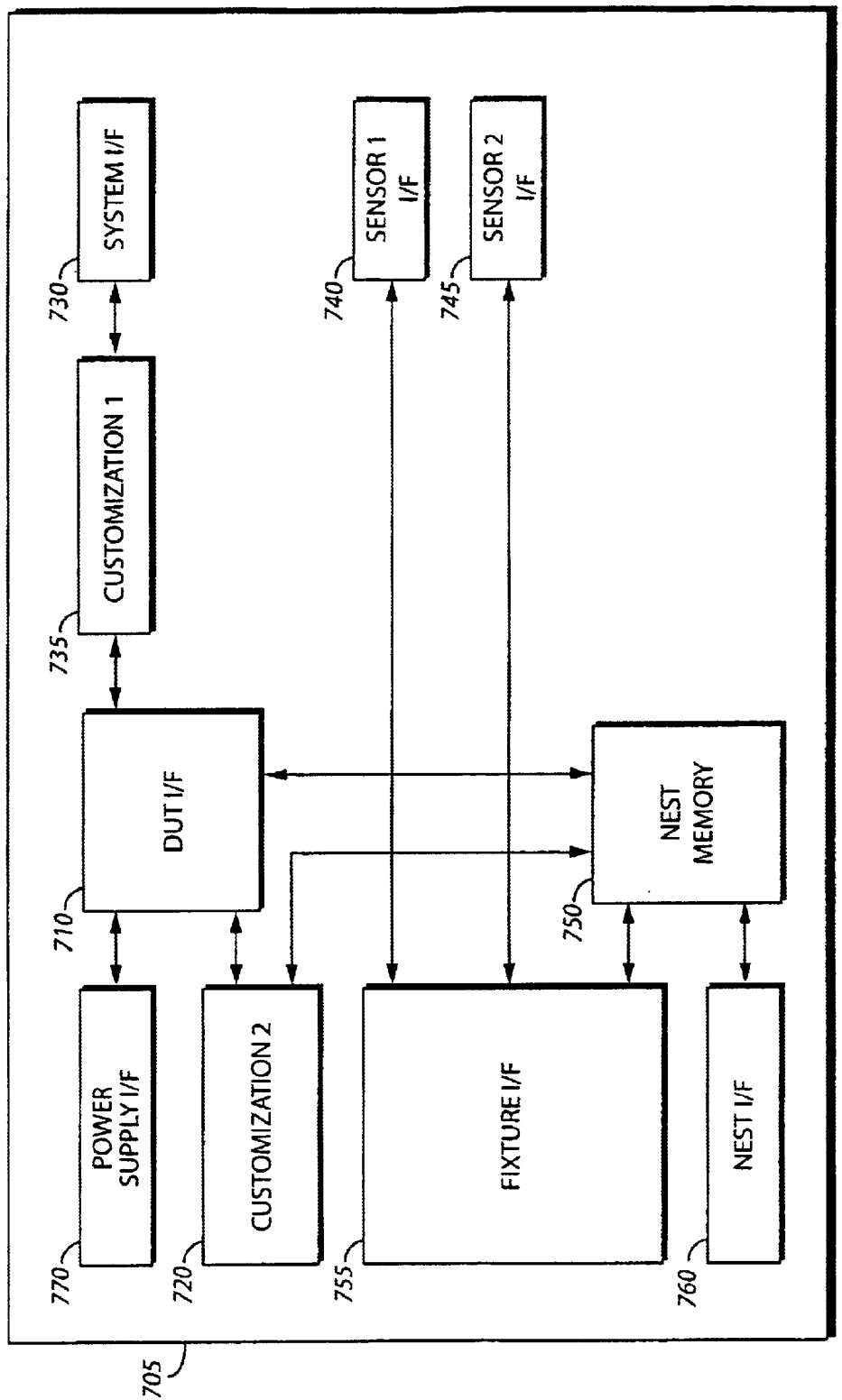
FIG. 7 is a block diagram of a nest, according to an embodiment of the present invention.

Referring now to FIG. 7, a block diagram 700 corresponding to a nest 705 is shown, according to an embodiment of the present invention. It should be noted that block diagram 700 could refer to lower nest 380 or upper nest 360, without departing from the spirit and scope of the present invention. The DUT 370 interfaces with fixturing device 270 through a coupling with DUT I/F 710. One or more customizations (block 720 and block 735) may be present on nest 705. These customizations interface with DUT 370 via the DUT I/F 710. Nest 705 also contains nest non-volatile memory 750 that is operable to store device related information, configuration information, operational programs, calibration data and operational parameters. Nest memory 750 is also operable to store algorithms and methods of reading, writing, revision control, corruption detection, and information back-ups. Nest memory 750 is coupled to DUT I/F 705, one or more customizations (block 720), and nest I/F 760. Nest I/F 760 is coupled to nest interface 390 and fixture interface 350. A second interface, a fixture I/F 755, is coupled to fixture interface 350. Fixture I/F 755 is operable to receive data from one or more sensors (block 740 and block 745). This sensor data is collected by fixture interface 350 for further processing and communication with electronics components external to RF enclosure 340. Thus nest 705 is operable to couple directly to DUT 370, send and receive data to DUT 370, receive and forward measurements collected by one or more sensors, provide stored DUT-specific information, calibration data, and system level information, and provide the user with the ability to customize the interface to DUT 370 via one or more customization components. A system I/F 730 provides a further capability to store and retrieve system related data, such as external power, user commands, and system status. A power supply I/F 770 provides power supply signals and signal conditioning from an external power supply 250 to the DUT I/F; the presence of power supply I/F 770 underlies the connection between the nest block diagram 700 of FIG. 7 and the system diagram 200 of FIG. 2.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. An electronics system operable to provide a standard RF test and measurement environment within an RF enclosure for a plurality of RF devices, comprising:
   one or more nests located within the RF enclosure, operable to receive an RF device of the plurality of RF devices, wherein a nest of the one or more nests has functionality specific to the RF device that in combination with a standard set of electronics of the electronics systems facilitates testing of the RF device;
   one or more nest interfaces located within the RF enclosure, coupled to the one or more corresponding nests, wherein a first distance from any nest interface of the one or more nest interfaces to the RF device is greater than a second distance from any of the one or more nests to the RF device;
   one or more fixture interfaces located within the RF enclosure, coupled to the one or more nest interfaces, said one or more fixture interfaces physically further from the RF device that than the one or more nests wherein a third distance from any fixture interface of the one or more fixture interfaces to the RF device is greater than a fourth distance from any of the one or more nests to the RF device; and
   one or more fixture controllers, coupled to the one or more fixture interfaces.

2. The system of claim 1, wherein a nest of the one or more nests further comprises:
   a DUT I/F module coupled to the RF device, said DUT I/F module operable to send data to the RF device and receive data from the RF device;
   a non-volatile memory module coupled to the DUT I/F module and coupled to one or more of the DUT I/F module, nest I/F module, and one or more customizations, said non-volatile memory module operable to store and retrieve RF device specific information;
   a fixture I/F module coupled to the DUT I/F module, and coupled to a fixture interface of the one or more fixture interfaces, said fixture I/F module operable to send data to the fixture interface and receive data from the fixture interface; and
   one or more sensor modules coupled to the fixture I/F module, said one or more sensor modules operable to collect one or more types of sensor data.

3. The system of claim 2, wherein said non-volatile memory module is operable to store and retrieve one or more of nest identification, calibration constants, acoustic path characteristics, configuration information, cycle counters, operational programs, test process information, and algorithms and methods of reading data, writing data, revision control, corruption detection, and backing up test process information.

4. The system of claim 1, wherein a nest interface of the one or more nest interfaces further comprises:
   a nest I/F module coupled to a nest of the one or more nests, said nest I/F module operable to receive data from the nest and send data to the nest;
   a multiplexer coupled to the nest I/F module, operable to take one or more data bus lines from the nest I/F module and create a fewer number of data bus lines;
   a nest fixture I/F module coupled to the multiplexer, and coupled to a fixture interface of the one or more fixture interfaces, said nest fixture I/F operable to receive data and to transmit data; and
   one or more sensors coupled to the nest fixture I/F module, said one or more sensors operable to collect one or more types of sensor data.

5. The system of claim 1, wherein a fixture interface of the one or more fixture interfaces further comprises:
   a nest interface I/F module coupled to a nest interface of the one or more nest interfaces, said nest interface I/F module operable to receive data from the nest interface and send data to the nest interface;
   a multiplexer coupled to the nest interface I/F module, operable to take one or more data lines from the nest interface I/F module and create a fewer number of data lines;
   an RF connector I/F module coupled to the multiplexer, and coupled to a fixture controller of the one or more fixture controller, said RF connector I/F operable to receive data and to transmit data; and
   one or more sensors coupled to the RF connector I/F module, said one or more sensors operable to collect one or more types of sensor data.

6. The system of claim 1, wherein a fixture controller of the one or more fixture controllers further comprises:
   an RF connector I/F module coupled to a fixture interface of the one or more fixture interfaces, said RF connector I/F module operable to receive data from the fixture interface and send data to the fixture interface;

a second multiplexer coupled to the RF connector I/F module, operable to take one or more data lines from the microprocessor module and create a fewer number of data lines;

a de-multiplexer coupled to the RF connector I/F module, operable to take one or more data bus lines from the microprocessor module and create a greater number of data bus lines;

a micro-controller, coupled to the RF connector, said micro-controller operable to interpret one or more commands received from one or more sources external to the system and communicate the one or more commands to a fixture interface of the one or more fixture interfaces;

a fixture control I/F, coupled to the microcontroller, said fixture control I/F operable to send one or more commands to the microcontroller and to receive one or more data values from the RF connector; and one or more sensors coupled to the fixture control I/F, said one or more sensors operable to collect one or more types of sensor data.

7. The system of claim 1, wherein the fixture controller is coupled to the fixture interface via a filtered connector.

8. The system of claim 1, wherein a system controller, external to the RF enclosure, is coupled to a fixture controller of the one or more fixture controllers.

9. The system of claim 1, wherein a nest of the one or more nests is operable to receive and store system level information.

10. The system of claim 1, wherein the one or more RF devices are operable to be tested by replacing one or more of the one or more nests.

11. The system of claim 1, wherein the one or more RF devices are operable to be tested by replacing one or more of the one or more nest components.

12. The system of claim 1, wherein a data bus operable to transfer information between system components is a serial data bus.

13. The system of claim 1, wherein a nest of the one or more nests further comprises one or more non-volatile memory devices.

14. The system of claim 1, wherein the fixture controller further comprises one or more non-volatile memory devices.

15. The system of claim 1, wherein the one or more nest interfaces further comprise one or more programmable code modules, coupled to the nest I/F module.

16. The system of claim 1, wherein a fixture interface of the one or more fixture interfaces is coupled to a nest of the one or more nests.

17. The system of claim 1, wherein a fixture controller of the one or more fixture controllers resides external to the RF enclosure.

18. The system of claim 1, wherein a fifth distance from a fixture controller to the RF device is greater than a sixth distance from the fixture interface to the RF device.

19. The system of claim 1, wherein the one or more nests comprises an upper nest and a lower nest.

20. The system of claim 19, wherein the upper nest is coupled to a fixture interface of the one or more fixture interfaces.

21. The system of claim 19, wherein the lower nest is coupled to a nest interface.

22. The system of claim 1, wherein analog multiplexing within an RF chamber of the system reduces the number of signals required to traverse an RF barrier of the RF enclosure.

23. The system of claim 1, wherein one or more data bus lines coupling a nest to the DUT are multiplexed in the nest interface.

24. The system of claim 23, wherein the multiplexing occurs as close to the DUT as possible.

25. The system of claim 23, wherein the multiplexed data remains multiplexed until entering a fixture controller of the one or more fixture controllers.

26. The system of claim 23, wherein the one or more data lines are multiplexed as close to the nest I/F module as physically possible.

27. An electronics system operable to provide a standard RF test and measurement environment within an RF enclosure for a plurality of RF devices, comprising:

one or more nests, operable to receive an RF device of the plurality of RF devices located within the RF enclosure, wherein a nest of the one or more nests has functionality specific to the RF device that in combination with a standard set of electronics of the electronics systems facilitates testing of the RF device and further comprises:

a DUT I/E module coupled to the RF device, said DUT I/E module operable to send data to the RF device and receive data from the RF device;

a fixture I/E module coupled to the DUT I/E module, and coupled to a fixture interface of the one or more fixture interfaces, said fixture I/F module operable to send data to the fixture interface and receive data from the fixture interface;

a non-volatile memory module coupled to the DUT I/E module and coupled to one or more of the DUT I/E module, nest I/E module, and one or more customizations, said non-volatile memory module operable to store and retrieve RF device specific information;

one or more sensor modules coupled to the fixture I/E module, said one or more sensor modules operable to collect one or more types of sensor data;

one or more nest interfaces located within the RF enclosure and coupled to the one or more corresponding nests, wherein a nest interface of the one or more nest interfaces is a greater distance from the RF device than a distance from any of the one or more nests to the RF device, wherein said nest interface further comprises:

a nest I/E module coupled to a nest of the one or more nests, said nest I/E module operable to receive data from the nest and send data to the nest;

a multiplexer coupled to the nest I/E module, operable to take one or more data bus lines from the nest I/E module and create a fewer number of data bus lines;

a nest fixture I/E module coupled to the multiplexer, and coupled to a fixture interface of the one or more fixture interfaces, said nest fixture I/E operable to receive data and to transmit data;

one or more sensors coupled to the nest fixture I/E module, said one or more sensors operable to collect one or more types of sensor data;

one or more fixture interfaces located within the RF enclosure and is coupled to the one or more nest interfaces, wherein a fixture interface of the one or more fixture interfaces is a greater distance from the RF device than the distance from any of the one or more nests to the RF device, wherein said fixture interface further comprises:

a nest interface I/E module coupled to a nest interface of the one or more nest interfaces, said nest interface I/E module operable to receive data from the nest interface and send data to the nest interface;

a multiplexer coupled to the nest interface I/E module, operable to take one or more data lines from the nest interface I/E module and create a fewer number of data lines;

an RF connector I/E module coupled to the multiplexer, and coupled to a fixture controller of the one or more fixture controller, said RF connector I/E operable to receive data and to transmit data;

one or more sensors coupled to the RF connector I/E module, said one or more sensors operable to collect one or more types of sensor data;

a fixture controller, coupled to the one or more fixture interfaces, said fixture controller further comprising:

an RF connector I/F module coupled to a fixture interface of the one or more fixture interfaces, said RF connector I/F module operable to receive data from the fixture interface and send data to the fixture interface;

a second multiplexer coupled to the RF connector I/F module, operable to take one or more data lines from the microprocessor module and create a fewer number of data lines;

a multiplexer coupled to the RF connector I/E module, operable to take one or more data bus lines from the microprocessor module and create a greater number of data bus lines;

a micro-controller, coupled to the RF connector, said micro-controller operable to interpret one or more commands received from one or more sources external to the system and communicate the one or more commands to a fixture interface of the one or more fixture interfaces; and a fixture control I/F, coupled to the microcontroller, said fixture control I/F operable to send one or more commands to the microcontroller and to receive one or more data values from the RF connector.

28. The system of claim 27, wherein the fixture controller is coupled to the fixture interface via filtered connector.

29. The system of claim 27, wherein a system controller, external to the RF enclosure, is coupled to a fixture controller of the one or more fixture controllers.

30. The system of claim 27, wherein a nest of the one or more nests is operable to store and receive system level information.

31. The system of claim 27, wherein the one or more RF devices are operable to be tested by replacing one or more of the one or more nests.

32. The system of claim 27, wherein the one or more RF devices are operable to be tested by replacing one or more of the one or more nest components.

33. The system of claim 27, wherein a data bus operable to transfer information between system components is an serial data bus.

34. The system of claim 27, wherein a nest of the one or more nests further comprises one or more non-volatile memory devices.

35. The system of claim 27, wherein the fixture controller further comprises one or more non-volatile memory devices.

36. The system of claim 27, wherein the one or more nest interfaces further comprise a signal simulation module coupled to the nest I/F.

37. The system of claim 27, wherein the one or more nest interfaces further comprise one or more programmable code modules, coupled to the nest I/F module.

38. The system of claim 27, wherein a nest of the one or more nests comprises a non-volatile memory module coupled to the DUT I/F module.

39. The system of claim 27, wherein a fixture interface of the one or more fixture interfaces is coupled to a nest of the one or more nests.

40. The system of claim 27, wherein a fixture controller of the one or more fixture controllers resides external to the RF enclosure.

41. The system of claim 27, wherein a third distance from a fixture controller to the RF device is greater than a fourth distance from the fixture interface to the RF device the fixture controller is located physically further from the RF device than the fixture interface.

42. The system of claim 27, wherein the one or more non-volatile memory devices are operable to store and retrieve one or more of nest identification, calibration constants, acoustic path characteristics, configuration information, cycle counters, operational programs, test process information, and algorithms and methods of reading data, writing data, revision control, corruption detection, and backing up test process information.

43. The system of claim 27, wherein the one or more nests comprises an upper nest and a lower nest.

44. The system of claim 43, wherein the upper nest is coupled to a nest interface.

45. The system of claim 43, wherein the lower nest is coupled to a nest interface.

46. The system of claim 27, wherein one or more data bus lines coupling a nest to the DUT are multiplexed in the nest interface.

47. The system of claim 46, wherein the multiplexing occurs as close to the DUT as possible.

48. The system of claim 46, wherein the multiplexed data remains multiplexed until entering a fixture controller of the one or more fixture controllers.

49. The system of claim 27, wherein the one or more data lines are multiplexed as close to the nest I/F module as physically possible.

50. An electronics system operable to provide a standard RF test and measurement environment within an RF enclosure for a plurality of RF devices, comprising:

an RF test fixture having a standard set of electronics;

a nest operable to receive an RF device to be tested in the RF test fixture, wherein the nest has functionality specific to the RF device that in combination with the standard set of electronics facilitates testing of the RF device; and an interface element operable as an interface between the standard set of electronics of the RF test fixture and the RF device.

51. The system of claim 50, wherein a second RF device of the plurality of RF devices residing in a second nest having functionality specific to the second RF device is operable to be tested in the system when the interface element is operable as an interface between the standard set of electronics of the RF test fixture and the second RF device.

52. An electronics system operable to provide a standard RF test and measurement environment within an RF enclosure for a plurality of RF devices, comprising:

one or more nests located within the RF enclosure, coupled to an RF device of the plurality of RF devices; and one or more of a nest interface, a fixture interface, and a fixture controller, coupled to the one or more nests, wherein the one or more of the fixture controller, the fixture interface and the nest interface is a greater distance from the RF device than a distance from any nest of the one or more nests to the RF device.

53. The system of claim 52, wherein a nest of the one or more nests further comprises:

a DUT I/F module coupled to the RF device, said DUT I/F module operable to send data to the RF device and receive data from the RF device;

a non-volatile memory module coupled to the DUT I/E module and coupled to one or more of the OUT I/E module, nest I/E module, and one or more customizations, said non-volatile memory module operable to store and retrieve RF device specific information;

a fixture I/F module coupled to the OUT I/F module, and operable to be coupled to the fixture interface, said fixture I/F module operable to send data to the fixture interface and operable to receive data from the fixture interface; and one or more sensor modules coupled to the fixture I/E module, said one or more sensor modules operable to collect one or more types of sensor data.

54. The system of claim 52, wherein the nest interface further comprises:

a nest I/F module coupled to a nest of the one or more nests, said nest I/F module operable to receive data from the nest and send data to the nest;

a multiplexer coupled to the nest I/F module, operable to take one or more data bus lines from the nest I/F module and create a fewer number of data bus lines;

a nest fixture I/F module coupled to the multiplexer, and operable to be coupled to the fixture interface, said nest fixture I/F operable to receive data and transmit data; and one or more sensors coupled to coupled to the nest fixture I/F, said one or more sensors operable to collect one or more types of sensor data.

55. The system of claim 52, wherein the fixture interface further comprises:

a nest interface I/F module operable to be coupled to the nest interface, said nest interface I/F module operable to receive data from the nest interface and operable to send data to the nest interface;

a multiplexer coupled to the nest interface I/F module, operable to take one or more data lines from the nest interface I/F module and create a fewer number of data lines;

an RF connector I/F module coupled to the multiplexer, and operable to be coupled to the fixture controller, said RF connector I/F operable to receive data and to transmit data; and one or more sensors coupled to the RF connector I/F module, said one or more sensors operable to collect one or more types of sensor data.

56. The system of claim 52, wherein the fixture controller further comprises:

an RF connector I/E module operable to be coupled to the fixture interface, said RF connector I/E module operable to receive data from the fixture interface and operable to send data to the fixture interface;

a second multiplexer coupled to the RF connector I/E module, operable to take one or more data lines from the microprocessor module and crate a fewer number of data lines;

a demultiplexer coupled to the RF connector I/F module, operable to take one or more data bus lines from the microprocessor module and create a greater number of data bus lines;

a micro-controller, coupled to the RF connector, said micro-controller operable to interpret one or more commands received from one or more sources external to the system and communicate the one or more commands to the fixture interface; and a fixture control I/F, coupled to the microcontroller, said fixture control I/F operable to send one or more commands to the microcontroller and to receive one or more data values from the RF connector.

* * * * *

UNITED STATES PATENT AND TRADEMARK OFFICE
CERTIFICATE OF CORRECTION

PATENT NO.    : 6,751,570 B2
DATED         : June 15, 2004
INVENTOR(S)   : Bryan D. Boswell et al.

It is certified that error appears in the above-identified patent and that said Letters Patent is hereby corrected as shown below:

Column 14,
Lines 62, 66 and 68, after "interface", delete "I/E" and insert therefor -- I/F --
Line 64, before "module", delete "I/E" and insert therefore -- I/F --

Column 15,
Lines 1, 3, 5 and 19, after "connector", delete "I/E" and insert therefore -- I/F --
Line 19, before "coupled", delete "multiplexer" and insert therefor -- de-multiplexer --

Column 17,
Line 1, after "DUT", delete "I/E" and insert therefor -- I/F --
Line 2, after "more of the", delete "OUT I/E" and insert therefor -- DUT I/F --
Line 3, after "nest", delete "I/E" and insert therefor -- I/F --
Line 7, after "coupled to the", delete "OUT" and insert therefor-- DUT --
Line 12, after "fixture", delete "I/E" and insert therefor -- I/F --

Column 18,
Lines 14, 15 and 18, after "connector", delete "I/E" and insert therefor -- I/F --

Signed and Sealed this

Sixteenth Day of November, 2004

JON W. DUDAS
*Director of the United States Patent and Trademark Office*